(12) United States Patent
Choi

(10) Patent No.: US 8,547,150 B2
(45) Date of Patent: Oct. 1, 2013

(54) PHASE-LOCKED LOOP WITH TWO NEGATIVE FEEDBACK LOOPS

(75) Inventor: Young Shig Choi, Busan (KR)

(73) Assignee: Pukyong National University Industry—Academic Cooperation Foundation, Busan (KR)

( * ) Notice: Subject to any disclaimer, the term of this patent is extended or adjusted under 35 U.S.C. 154(b) by 0 days.

(21) Appl. No.: 13/353,477

(22) Filed: Jan. 19, 2012

(65) Prior Publication Data

US 2013/0187689 A1   Jul. 25, 2013

(51) Int. Cl.
*H03L 7/06* (2006.01)

(52) U.S. Cl.
USPC .......................................... 327/156; 327/147

(58) Field of Classification Search
None
See application file for complete search history.

(56) References Cited

U.S. PATENT DOCUMENTS

| | | | |
|---|---|---|---|
| 6,262,609 B1 * | 7/2001 | Hafez et al. ................... | 327/156 |
| 6,437,615 B1 * | 8/2002 | Stascausky ................... | 327/156 |
| 7,336,755 B1 * | 2/2008 | Tetzlaff ........................ | 375/376 |
| 7,345,550 B2 * | 3/2008 | Bellaouar et al. ............... | 331/17 |
| 8,049,568 B2 * | 11/2011 | Youssef et al. .................. | 331/17 |
| 2009/0195276 A1 * | 8/2009 | Griffiths ....................... | 327/157 |
| 2010/0073051 A1 * | 3/2010 | Rao et al. ...................... | 327/157 |

* cited by examiner

*Primary Examiner* — Cassandra Cox
(74) *Attorney, Agent, or Firm* — Sherr & Jiang, PLLC

(57) ABSTRACT

A phase-locked loop with two negative feedback loops including: a phase frequency detector which includes phase difference between the input clock and the feedback clock in a frequency-phase-locked loop and outputting up or down signals based on the phase difference; a charge pump outputting the current proportional to the up and down signals outputted from the phase frequency detector; a loop filter outputting the voltage by filtering the current outputted from the charge pump; a voltage controlled oscillator outputting the frequency based on the voltage outputted from the loop filter; a divider dividing the frequency outputted from the voltage controlled oscillator and feedbacking to the phase frequency detector; a frequency-voltage converter generating the voltage corresponding to the frequency outputted from the voltage controlled oscillator, and suppressing noise of the voltage controlled oscillator by feedbacking the generated voltage to the voltage controlled oscillator.

3 Claims, 6 Drawing Sheets

(a)

(b)

(a)

(b)

(c)

PHASE-LOCKED LOOP WITH TWO NEGATIVE FEEDBACK LOOPS

BACKGROUND OF THE INVENTION

1. Field of the Invention

This invention relates to a phase-locked loop with two negative feedback loops. The outer negative feedback loop is a conventional PLL loop. The inner negative feedback loop consists of a voltage controlled oscillator (VCO) and a frequency voltage converter (FVC) is inside a conventional outer PLL loop. The inclusion of the inner negative feedback loop of a VCO and an FVC improves the phase noise characteristic and the stability of PLL.

2. Description of the Related Art

Phase-locked loops (PLLs) have become ubiquitous in modern communication systems and integrated chips because of their versatility. Phase-locked loops (PLLs) have been used popularly such as frequency multiplication synthesis for communication system, and high frequency clock signal for integrated digital chips.

FIG. 1 is a block diagram showing the structure of the conventional phase-locked loop.

As shown in FIG. 1, the phase-locked loop (PLL) comprises a phase frequency detector (PFD) (10) comparing the phase difference between the given input signal to the PLL and the feedback signal, and outputting up or down signal based on the phase difference, a charge pump (CP) (20) outputting the current proportional to the up and down signals outputted from the phase frequency detector (10); a loop filter (LPF) (30) outputting the voltage by filtering the current outputted from the charge pump (20); a voltage-controlled oscillator (40) outputting the frequency based on the voltage outputted from the loop filter (30); a divider (50) dividing the frequency outputted from the voltage-controlled oscillator (40) and feedbacking to the phase frequency detector (10); and changes the frequency depending on the signal which is inputted into PLL.

This typical PLL reduces the jitter in the output clock signal or suppresses the phase noise in the output signal by filtering the high frequency jitter or phase noise components in the authorized reference clock (or input clock).

The phase-locked loops (PLLs) have been widely used as frequency multipliers in communication systems and high frequency clock signal generators in integrated digital chips. The voltage-controlled oscillator (VCO) is an oscillator circuit for obtaining the desired frequency output by controlling its input voltage.

At this point, the voltage-controlled oscillator (VCO) (40) in the PLL is a circuit for generating a specific frequency by the control voltage. Commonly used oscillators are an LC VCO or a ring VCO.

The LC VCO is suitable for communication systems because it is superior to the ring VCO in terms of noise characteristics. However, in the standard CMOS process, a bulky inductor is expensive because it is not a standard device yet requires a large area.

On the other hand, a ring oscillator is suitable for clock signal generation used in digital chips because it occupies small area. That is, a ring oscillator can be used in circuits having no strict requirement regarding the phase noise characteristics, and can be easily made by the standard CMOS process. Moreover, a ring oscillator has a wide frequency range.

When a ring-type oscillator or LC VCO is used in a phase-locked loop, commonly used method of suppressing VOC noise of a phase-locked loop is to have a wide bandwidth. However, the large bandwidth cannot suppress other block's noise which has a low-pass transfer characteristic.

SUMMARY OF THE INVENTION

The present invention is conceived to solve the above-described problems. An object of the present invention is to provide the phase-locked loop with two negative feedback loops. The outer negative feedback loop is a conventional PLL loop. The inner negative feedback loop consists of a voltage controlled oscillator (VCO) and a frequency voltage converter (FVC) is inside a conventional outer PLL loop. The inclusion of the inner loop of a VCO and an FVC improves the phase noise characteristic and the stability of PLL.

Another object of the present invention is to provide a phase-locked loop wherein it, through the inner loop of a VCO and an FVC, significantly reduces the size of capacitors of a loop filter and easily implements PLL to a single chip.

In order to attain the above-described object, the phase-locked loop with two negative feedback loops according to the present invention comprising: a phase frequency detector comparing the phase difference between the input signal and the feedback signal in the phase-locked loop and outputting up or down signal based on the phase difference; a charge pump outputting the current proportional to the up and down signals outputted from the phase frequency detector; a loop filter outputting the voltage by smoothing the current outputted from the charge pump; a voltage controlled oscillator outputting the frequency based on the voltage outputted from the loop filter; a divider dividing the frequency outputted from the voltage controlled oscillator and feedbacking to the phase frequency detector; a frequency-voltage converter generating the voltage corresponding to the frequency outputted from the voltage controlled oscillator, and suppressing noise of the voltage controlled oscillator by feedbacking the generated voltage to the voltage controlled oscillator.

Desirably, the above voltage controlled oscillator is either one of a ring oscillator and an LC oscillator.

Desirably, the inner loop of the frequency-voltage converter and the voltage controlled oscillator consists of a negative feedback closed loop independently from the closed loop of the whole phase-locked loop.

Desirably, the above loop filter consists of a RC filter wherein resistance (Rz) and 1 capacitor (Cz) are connected in series, and a RC second-order loop filter connected to 2 capacitor (Cp) wherein RC filter and 2 capacitor (Cp) are connected in parallel.

Desirably, the above loop filter consists of a single capacitor (C) wherein one side is connected to the output stage of the charge pump, and the other side is connected to the ground voltage.

Desirably, the above loop filter consists of a RC filter wherein resistance (Rz) and 1 capacitor (Cz) are connected in series; 2 capacitor (Cp) and 3 capacitor (C3) wherein each of 2 capacitor (Cp) and 3 capacitor (C3) is connected to the RC filter in parallel; a RC second-order loop filter wherein resistant (R3) is connected in series between 1 RC loop filter and 2 RC loop filter.

Desirably, the above loop filter consists of 1 capacitor (Cp) and 2 capacitor (C3) wherein each of the of 1 capacitor (Cp) and 2 capacitor (C3) is connected to the output stage of a charge pump (200) in parallel; a RC loop filter wherein resistance (R3) is connected in series between the 1 capacitor (Cp) and the 2 capacitor (C3).

Desirably, the above loop filter consists of 1 capacitor (Cp), 2 capacitor (C3) and 3 capacitor (C4) wherein each of them is connected in parallel to the output stage of the charge pump;

a RC loop filter wherein 1 resistance (R3) is connected in series between the 1 capacitor (Cp) and 2 capacitor (C3), and 2 resistance (R4) is connected in series between the 2 capacitor (C3) and 3 capacitor (C4).

Desirably, the above frequency-voltage converter comprises a PMOS transistor which is switched through the frequency outputted from the voltage controlled oscillator inputted into gate node, consisting of an inverter circuit wherein drain nodes are interconnected and one side is connected to the ground voltage, and a NMOS transistor which is switched through 2 control signal generated from the control signal generating part inputted into gate node; a sampling switch wherein it consists of a CMOS transmission gate which is transformed by adding one or more complementary transistors on both sides and its one side is connected to the drain node of the NMOS transistor and the PMOS transistor, and the other side of this is connected to the output stage which is fed back into the voltage controlled oscillator, and it is switched through a 1 control signal and an inverted 1 control signal generated from the control signal generating part inputted into the gate node; two capacitors wherein each side is connected to the front end and back end of the sampling switch, and the other side is connected to the ground voltage.

Desirably, the above control signal generating part consists of three (3) inverters and two (2) AND gates, and generates 1 control signal (Φ1) and 2 control signal (Φ2) with delay time compared to 1 control signal (Φ1) by inputting the signal outputted from the voltage controlled oscillator.

Desirably, there is no overlapping part in 1 control signal (Φ1) and 2 control signal (Φ2) generated from the control signal generating part.

The inclusion of the inner loop of a VCO and an FVC improves the phase noise characteristic and the stability of PLL. It enables the PLL to use more various loop filters to suppress the phase noise further.

Another effect of the present invention is to provide a phase-locked loop wherein it, through the inner loop of a VCO and an FVC, significantly reduces the size of capacitors of a loop filter and easily implements PLL to a single chip.

THE BRIEF DESCRIPTION OF THE DRAWINGS

FIG. 1 is a block diagram showing the structure of a conventional phase-locked loop.

FIG. 2 is a block diagram showing the structure of a phase-locked loop with two negative feedback loops according to the embodiments of the present invention. The outer negative feedback loop is a conventional PLL loop. The inner negative feedback loop consists of a voltage controlled oscillator (VCO) and a frequency voltage converter (FVC) is inside a conventional outer PLL loop.

DESCRIPTION OF THE PREFERRED EMBODIMENT

Other objects, features and advantages of the present invention will be clarified hereinafter through detailed description on the embodiments with reference to the accompanying drawings.

Hereinafter, preferred embodiment of the phase-locked loop with two negative feedback loops according to the present invention will be described in detail with reference to the accompanying drawings.

The embodiments described below are provided to fully initiate the present invention and to fully inform the scope of the invention to one having ordinary skill in the art but are not intended to limit the scope of the present invention. One ordinarily skilled in the art can make various changes and modifications within the scope of the present invention.

Therefore, the embodiments described in the specification and structures shown on the drawings are simply the most desirable examples of the present invention, not represent every technical spirit in the present invention. Therefore, it is necessary to understand that there can be various equivalents and modifications at the point of filing.

Figure 1:
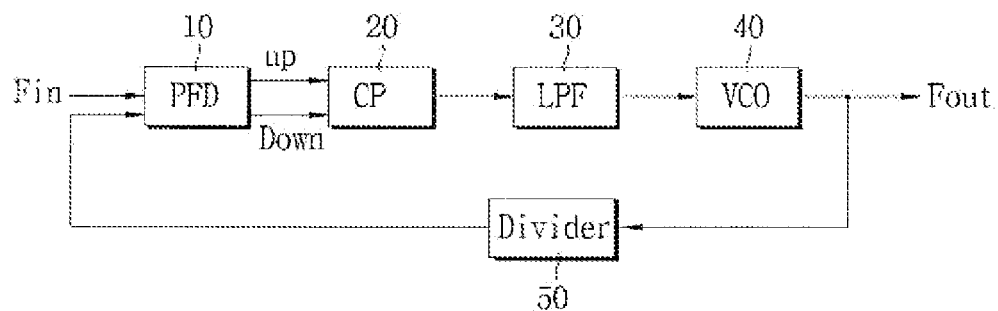
Figure 2:
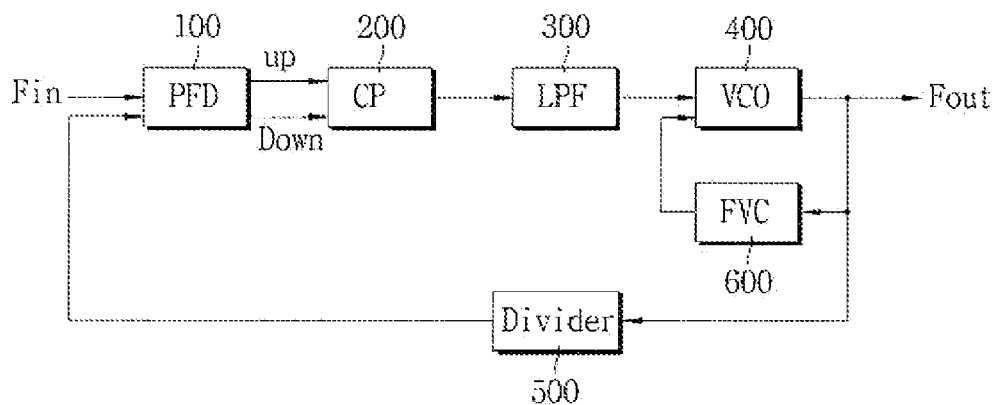

FIG. 2 is a block diagram showing the structure of a phase-locked loop with two negative feedback loops according to the embodiments of the present invention.

As shown in FIG. 2, a phase-locked loop with two negative feedback loops comprising: a phase frequency detector (PFD) (100) comparing phase difference between the input signal and the feedback signal in a phase-locked loop with two negative feedback loops and outputting up or down signal based on the phase difference; a charge pump (CP) (200) outputting the current proportionate to the up and down signals outputted from the phase frequency detector; a loop filter (LPF) (300) outputting the voltage by filtering the current outputted from the charge pump (CP) (200); a voltage controlled oscillator (VCO) (400) outputting the frequency based on the voltage outputted from the loop filter (300); a divider (500) dividing the frequency outputted from the voltage controlled oscillator (400) and feedbacking to the phase frequency detector (100); a frequency-voltage converter generating the voltage corresponding to the frequency outputted from the voltage controlled oscillator, and suppressing noise of the voltage controlled oscillator by feedbacking the generated voltage to the voltage controlled oscillator.

Like this, the inner loop of the above frequency-voltage converter (600) and the voltage controlled oscillator (400) consists of a negative feedback closed loop capable of suppressing the noise of the voltage controlled oscillator (400) independently from the closed loop of the whole phase-locked loop.

Figure 3:
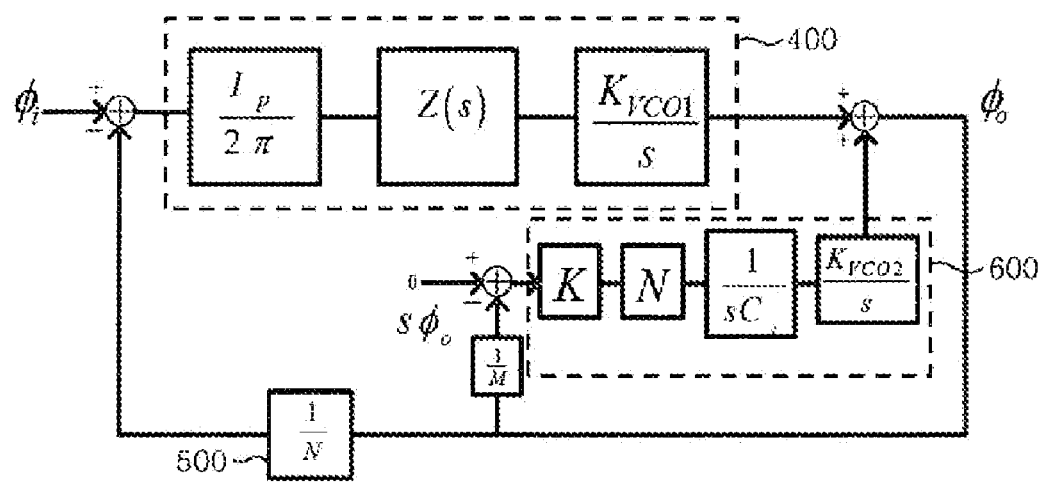
FIG. 3 is a block diagram showing a linear model of the phase-locked loop with two negative feedback loops.

FIG. 3 is a block diagram showing a linear model of the phase-locked loop with two negative feedback loops.

As shown in FIG. 3, it shows a linear model of the phase-locked loop with two negative feedback loops consisting of a phase frequency detector (PFD) (100), a charge pump (CP) (200), a loop filter (LPF) (300), a voltage controlled oscillator (400), a divider (500) and a frequency-voltage converter (600), and the transfer function of the phase-locked loop with two negative feedback loops results in the phase noise reduction in the wide range of frequency and more than 25 dB around the bandwidth of the conventional PLL.

The negative feedback loop of a frequency-voltage converter (600) and a voltage controlled oscillator (400) can be designed independently. A loop filter (300), which can be used in the phase-locked loop with two negative feedback loops includes the loop filter (300) consisting of a single capacitor and the conventional second-order/third order loop filter (300), and various orders and types of loop filter (300) which are more effective in suppressing phase noise. Detailed description on the above will be clarified hereinafter.

FIG. 4-FIG. 8 are flowcharts minutely illustrating the preferred embodiments of the structure of the loop filter of FIG. 2.

Figure 4:
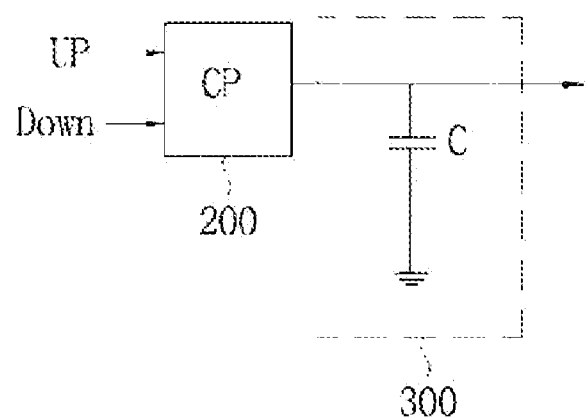
FIG. 4-FIG. 8 are flowcharts minutely illustrating the preferred embodiments of the structure of the loop filter of FIG. 2.
Figure 5:
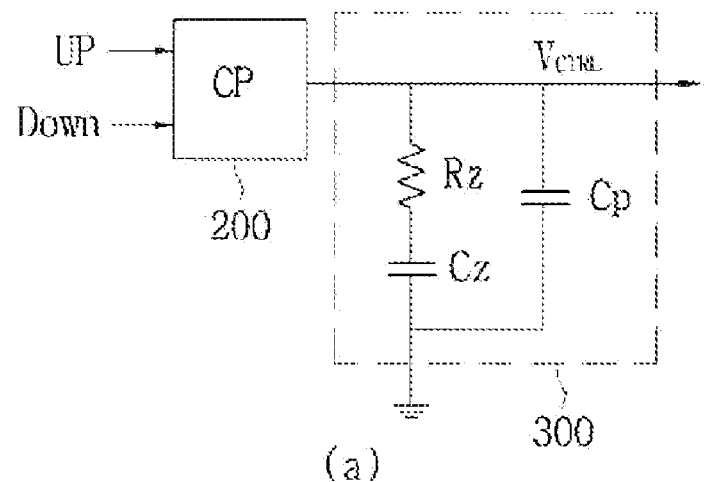
Figure 5:
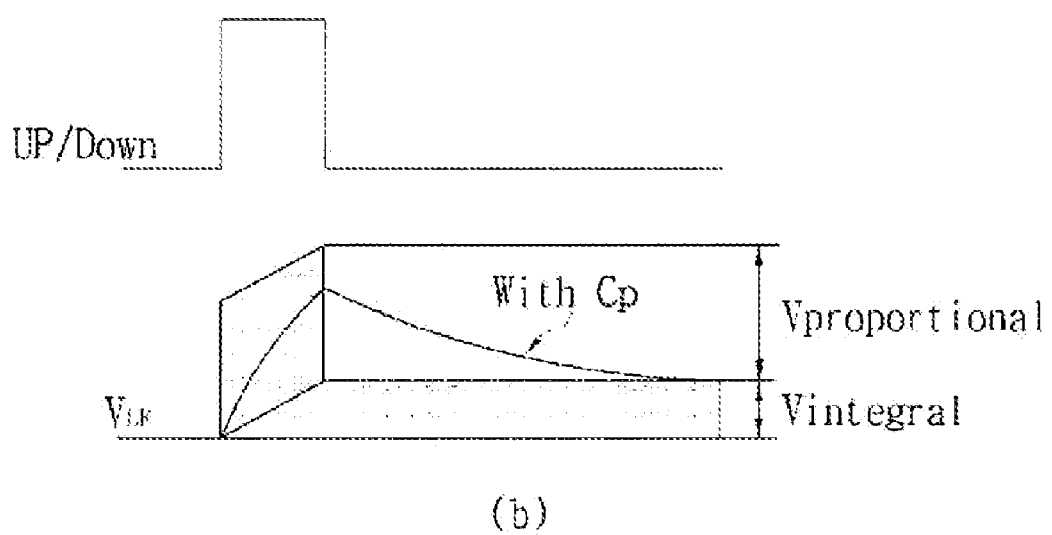

First, as shown in FIG. 4, the loop filter (300) consists of a single capacitor (C) wherein one side is connected to the output stage of the charge pump (200), and the other side is connected to ground voltage.

In case of evaluating a transfer function based on the output voltage of the loop filter (300) of FIG. 4, it is shown as following mathematical model 1.

Mathematical model 1
$$\frac{Q_0}{Q_i} = \frac{\frac{I_P}{2\pi} \frac{1}{SC} \frac{K_{VCO1}}{S}}{1 + \frac{1}{N} \frac{I_P}{2\pi} \frac{1}{SC} \frac{K_{VCO1}}{S} + \frac{K}{SC_Y} K_{VCO2}}$$

Where $I_p$ is the amount of a current supplied by the charge pump (200), $K_{VOC1}$ and $K_{VCO2}$ are the gains of the voltage-controlled oscillator (400). C is value of passive element of the low-pass filter. K is the gain of the frequency-voltage converter (FVC) (600), and $C_Y$ is value of passive element of the low-pass filter used in the frequency-voltage converter. N is division ratio of the divider (500).

On the other hand, the conventional phase-locked loop shows transfer function as following mathematical model 2.

Mathematical model 2
$$\frac{\phi_o}{\phi_i} = \frac{\frac{I_p}{2\pi} \frac{1}{sC_p} \frac{s+z}{s+p} \frac{K_{VCO}}{s}}{1 + \frac{1}{N} \frac{I_p}{2\pi} \frac{1}{sC_p} \frac{s+z}{s+p} \frac{K_{VCO}}{s}}$$

Where $z=1/R_zC_z$, $p=1/R_zC_p$. $I_p$ is the amount of a current supplied by the charge pump (200), $K_{VCO}$ is the gain of the voltage controlled oscillator (400); Rz, Cz and Cp are the values of passive element of the low-pass filter (30). N is division ratio of the divider (500).

Comparing Mathematical models 1 and 2, this shows that $$\frac{1}{C} \cdot \frac{K_{VCO2}}{K_{VCO1}}$$

in Mathematical model 1 and R in Mathematical model 2 refer to the same variables. Namely, from the viewpoint of a phase-locked loop, proposed structures are operated stable by the effective R of $$\frac{1}{C} \cdot \frac{K_{VCO2}}{K_{VCO1}}$$

which makes a low frequency zero.

Another embodiment, as in FIG. 5a, loop filter (300) consists of a RC filter wherein resistance (Rz) and 1 capacitor (Cz) are connected in series, and a RC second-order loop filter connected to 2 capacitor (Cp) wherein RC filter and 2 capacitor (Cp) are connected in parallel.

In case of evaluating a transfer function based on the output voltage of the loop filter (300) of FIG. 5a, it is shown as following mathematical model 3.

Mathematical model 3
$$\frac{Q_0}{Q_i} = \frac{\frac{I_P}{2\pi} \frac{1}{C_P} \frac{S+Z_1}{S(S+P1)} \frac{K_{VCO1}}{S}}{1 + \frac{1}{N} \frac{I_P}{2\pi} \frac{1}{C_P} \frac{S+Z_1}{S(S+P1)} \frac{K_{VCO1}}{S} + \frac{K}{SC_Y} K_{VCO2}}$$

At this point, $$P_1 = \frac{1}{R_Z C_P} \text{ and } Z_1 = \frac{1}{R_Z C_Z}.$$

Comparing Mathematical models 2 and 3, this shows that frequency-voltage converter makes phase-locked loop operate more stable. According to the Routh Hurwitz Stability Criterion, this allows phase-locked loop to operate stable regardless of the resistance (Rz) of the loop filter (300) and the size of 1 capacitor (Cz) and 2 capacitor (Cp).

Therefore as shown in FIG. 5b, up/down output signals are generated when the phase frequency detector (100) detects the difference between two input signals, and up/down output signals make the current of the charge pump (200) flow into the loop filter (300). This current generates voltage in the resistance (Rz) of the loop filter (300), 1 capacitor (Cz) and 2 capacitor (Cp). The sum of these two voltages, "$V_{proportional}$", and $V_{intergral}$", determines the output frequency and phase.

Figure 6:
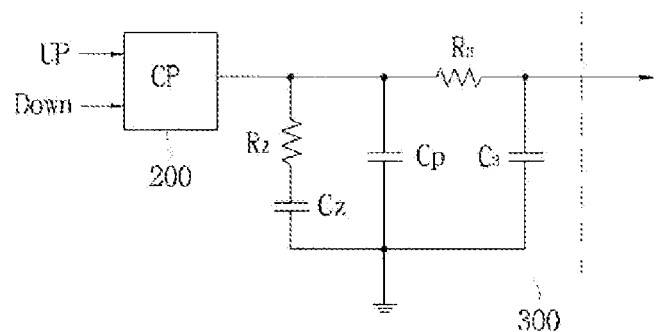

Another embodiment, as in FIG. 6, the loop filter (300) consists of a RC filter wherein a resistance (Rz) and 1 capacitor (Cz) are connected in series; 2 capacitor (Cp) and 3 capacitor (C3) wherein each of the 2 capacitor (Cp) and 3 capacitor (C3) is connected to the RC filter in parallel; a RC second-order loop filter wherein a resistant (R3) is connected in series between the 1 RC loop filter and 2 RC loop filter.

In case of evaluating a transfer function based on the output voltage of the loop filter (300) of FIG. 6, it is shown as following mathematical model 4.

Mathematical model 4
$$\frac{Q_0}{Q_i} = \frac{\frac{I_P}{2\pi} \frac{1}{C_P} \frac{1}{R_3 C_3} \frac{S+Z_1}{S(S+P1)} \frac{1}{S+P_3} \frac{K_{VCO1}}{S}}{1 + \frac{1}{N} \frac{I_P}{2\pi} \frac{1}{C_P} \frac{1}{R_3 C_3} \frac{S+Z_1}{S(S+P1)} \frac{1}{S+P_3} \frac{K_{VCO1}}{S} + \frac{K}{SC_Y} K_{VCO2}}$$

At this point, $$P_1 = \frac{1}{R_Z C_P}, Z_1 = \frac{1}{R_Z C_Z} \text{ and } P_3 = \frac{1}{R_2 C_3}.$$

Comparing Mathematical models 2 and 4, this shows that frequency-voltage converter makes phase-locked loop operate more stable. The phase-locked loop with two negative feedback loops can make the location of $$P_3 = \frac{1}{R_2 C_3} \text{ close to } P_1 = \frac{1}{R_Z C_P},$$

and thus allows to suppress the noise further.

Figure 7:
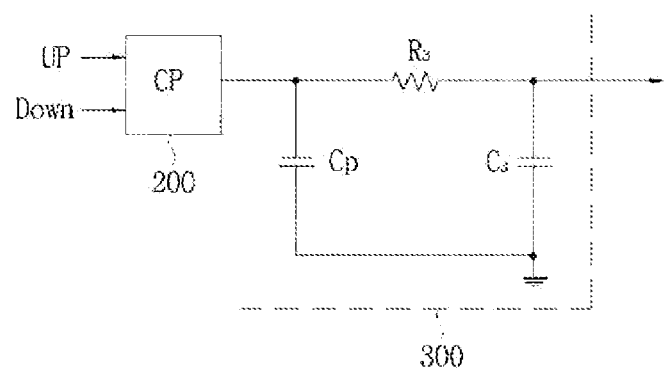

Another embodiment, as in FIG. 7, the loop filter (300) consists of 1 capacitor (Cp) and 2 capacitor (C3) wherein each of the of 1 capacitor (Cp) and 2 capacitor (C3) is connected to the output stage of the charge pump (200) in parallel; a RC loop filter wherein a resistance (R3) is connected in series between the 1 capacitor (Cp) and 2 capacitor (C3).

In case of evaluating a transfer function based on the output voltage of the loop filter (300) of FIG. 7, it is shown as following mathematical model 5.

Mathematical model 5

$$\frac{Q_0}{Q_i} = \frac{\frac{I_P}{2\pi}\frac{1}{C_P}\frac{1}{R_3C_3}\frac{1}{S\left(S+\frac{1}{R_3C_3}\right)}\frac{K_{VCO1}}{S}}{1+\frac{1}{N}\frac{I_P}{2\pi}\frac{1}{C_P}\frac{1}{R_3C_3}\frac{1}{S\left(S+\frac{1}{R_3C_3}\right)}\frac{K_{VCO1}}{S}+\frac{K}{SC_Y}K_{VCO2}}$$

If the loop filter of FIG. 7 is used in the structure of the conventional phase-locked loop without frequency-voltage converter, the phase-locked loop cannot be operated stable. Comparing Mathematical models 2 and 5, this shows that the requirements for the stable operation of the phase-locked loop with frequency-voltage converter can be obtained using the Routh Hurwitz Stability Criterion. This structure allows to suppress the noise further.

Figure 8:
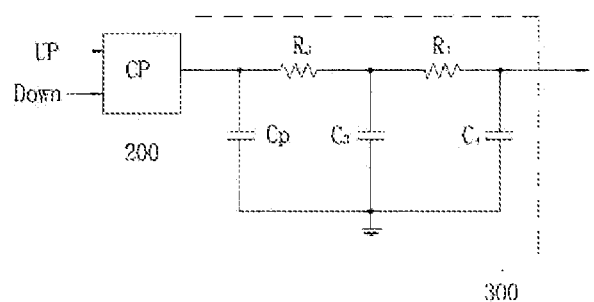

Another embodiment, as in FIG. 8, the loop filter (300) consists of a capacitor (Cp), 2 capacitor (C3) and 3 capacitor (C4) wherein each of them is connected to the output state of a charge pump (200) in parallel; a RC loop filter wherein 1 resistance (R3) is connected in series between the 1 capacitor (Cp) and 2 capacitor (C3), and 2 resistance (R4) is connected in series between the 2 capacitor (C3) and 3 capacitor (C4).

In case of evaluating a transfer function based on the output voltage of the loop filter (300) of FIG. 8, it is shown as following mathematical model 6.

Mathematical model 6

$$\frac{Q_0}{Q_i} = \frac{\frac{I_P}{2\pi}\frac{1}{C_P}\frac{1}{R_3C_3}\frac{1}{R_4C_4}\frac{1}{S(S+P_3)(S+P_4)}\frac{K_{VCO1}}{S}}{1+\frac{1}{N}\frac{I_P}{2\pi}\frac{1}{C_P}\frac{1}{R_3C_3}\frac{1}{R_4C_4}\frac{1}{S(S+P_3)(S+P_4)}\frac{K_{VCO1}}{S}+\frac{K}{SC_Y}K_{VCO2}}$$

At this point, $$P_3 = \frac{1}{R_3C_3} \text{ and } P_4 = \frac{1}{R_4C_4}.$$

If the loop filter of FIG. 8 is used in the structure of the conventional phase-locked loop without frequency-voltage converter, phase-locked loop cannot be operated stable. Comparing Mathematical models 2 and 6, this shows that the requirements for the stable operation of the phase-locked loop with frequency-voltage converter can be obtained using the Routh Hurwitz Stability Criterion. This structure allows to suppress the noise with −80 dBc/Hz slope.

FIG. 9a is a schematic diagram minutely illustrating the structure of the frequency-voltage converter (FVC) of FIG. 2; FIG. 9b is a schematic diagram of the control signal generation inputted to frequency-voltage converter (FVC); FIG. 9c is a timing diagram of the control signal generated from the control signal generation circuit of FIG. 9b.

As shown in FIG. 9a, the frequency-voltage converter (FVC) (600) consists of two NMOS (mn) and PMOS (mp) transistors and two capacitors (Cx) (Cy) and a single sampling switch.

At this point, the two NMOS (mn) and PMOS (mp) transistors consist of an the inverter circuit wherein drain nodes are interconnected and one side is connected to ground voltage; the PMOS (mp) transistor switches through the voltage controlled oscillator output frequency ($F_{out}$) which entered into the gate node; the NMOS (mn) transistor switches through 2 control signal (Φ2) which generated from the control signal generating part.

The sampling switch consists of a CMOS transmission gate transformed by adding one or more complementary transistors on both sides and one side is connected to the drain node of the NMOS (mn) and PMOS (mp) transistors and the other side is connected to the output stage which fed back to the voltage controlled oscillator (400). And, switches through 1 control signal and inverted 1 control signal, which is generated from the control signal generating part inputted to the gate node.

For the two capacitors (Cx) (Cy), each side is connected to the front end and back end of sampling switch, and the other side is connected to the ground voltage.

Also, the control signal generating part, as shown in FIG. 9b, consists of three (3) inverters and two (2) AND gates, and generates 1 control signal (Φ1) and 2 control signal (Φ2) with delay time compared to 1 control signal (Φ1) by entering output frequency ($F_{out}$) of the voltage controlled oscillator (400). The 1 control signal (Φ1) and 2 control signal (Φ2) are non-overlapping signals.

Figure 9:
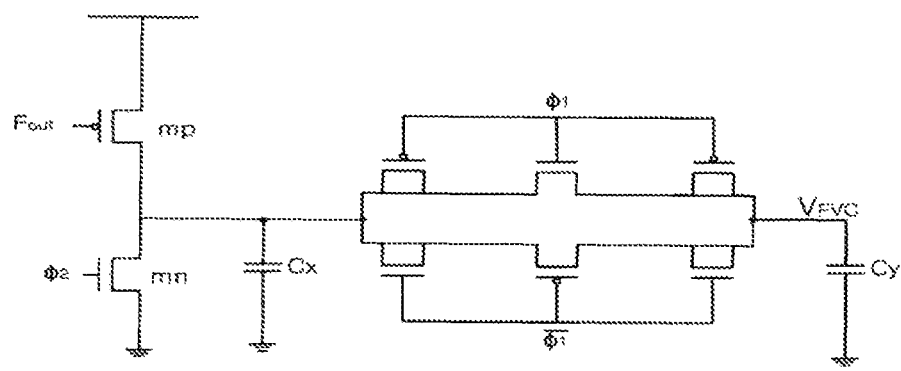
FIG. 9a is a schematic diagram minutely illustrating the structure of the frequency-voltage converter (FVC) of FIG. 2.
FIG. 9b is a schematic diagram of the control signal generation inputted into the frequency-voltage converter (FVC).
FIG. 9c is a timing diagram of the control signal generated from the control signal generation circuit of FIG. 9b.
Figure 9:
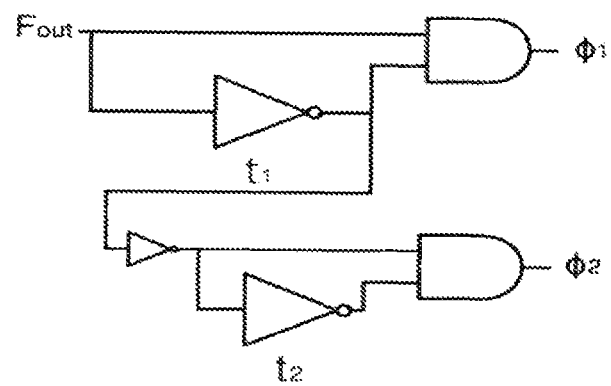
Figure 9:
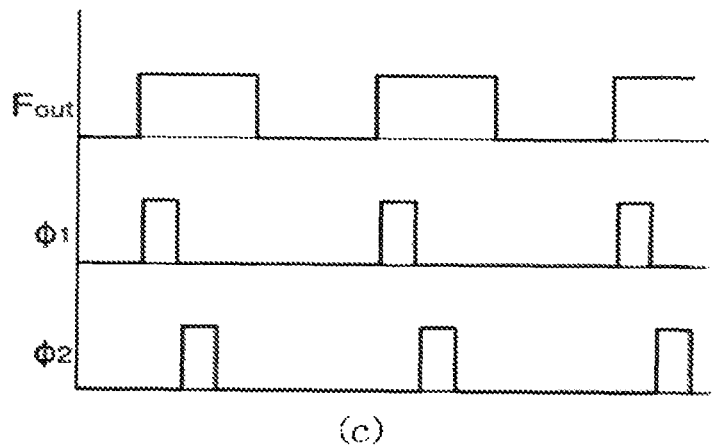

For reference, a schematic diagram shown at FIG. 9, which illustrates in detail the structure of a frequency-voltage converter (FVC), is an implemented circuit wherein it is switched when the output signal ($F_{out}$) of the voltage controlled oscillator (400) is at its low level. This is one preferred embodiment, and it is apparent that one having ordinary skill in the art can easily implement a circuit, wherein it is switched when the output signal ($F_{out}$) of the voltage controlled oscillator (400) is at its high level, within the scope of the technical spirits of the present invention.

Hereinafter, the function of the phase-locked loop with two negative feedback loops according to the present invention will be described in detail with reference to the accompanying drawings.

Figure 10:
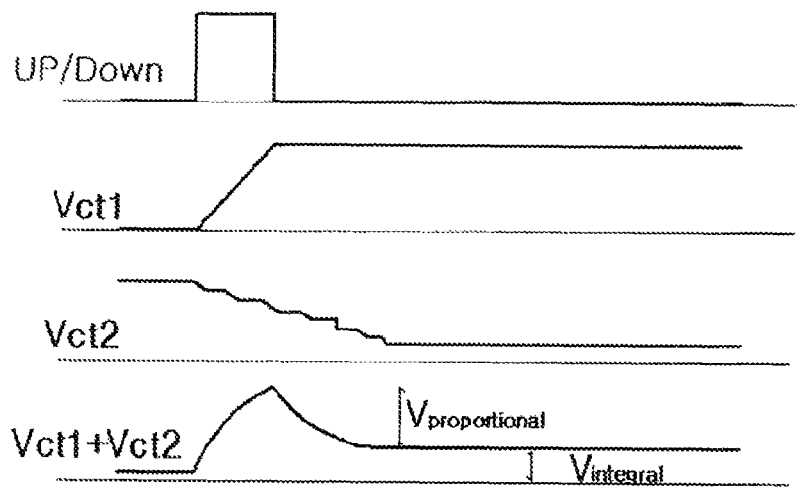
FIG. 10 is a timing diagram showing the output voltages of the frequency-voltage converter and the loop filer with the conceptual input voltage of a VCO according to the embodiments of the present invention.

FIG. 10 is a timing diagram showing the output voltages of the frequency-voltage converter and the loop filer with, the conceptual input voltage of a VCO according to the embodiments of the present invention.

When a PFD detects a phase error, it asserts UP or DN outputs, as shown in FIG. 10. Most of current of the charge pump (200), at the up-signal outputted from the phase frequency detector (100), flows into 2 capacitor (Cp) in the loop filter (300) and it gives rise to a voltage. The output frequency ($F_{out}$) of the voltage controlled oscillator (400) increases as the voltage rises. Therefore, the increased frequency decreases the output voltage ($V_{FVC}$) of the frequency-voltage converter (600). Finally, the decreased output voltage ($V_{FVC}$) decreases the output frequency ($F_{out}$) of the voltage controlled oscillator (400).

On the other hand, for the frequency-voltage converter (600), when the output frequency ($F_{out}$) of the voltage controlled oscillator (400) is at its low level, PMOS (mp) transistor is turned on and Cx is charged. While $\Phi_1$ is high, sampling switch is turned on and the charge is transferred from $C_x$ to $C_y$. While $\Phi_2$ is high, transistor MMOS (mn) is turned on and the remaining charge of $C_x$ is discharged to ground.

The output voltage of frequency-voltage converter (600) depends, on the period of $F_{out}$. As the frequency of $F_{out}$ goes high, the $V_{FVC}$ goes low. As the frequency of $F_{out}$ goes low, the $V_{FVC}$ goes high. When the output voltage of the loop filter (300) changes, the output voltage of the frequency-voltage converter (600) changes in the opposite direction at a much higher sampling frequency in PLL. Whenever the voltage controlled oscillator (400) output frequency varies, the frequency-voltage converter (600) works as a compensator and it results in frequency-voltage converter (600) noise reduction.

At this point, the gain (K) of the frequency-voltage converter (600) is calculated from the next mathematical model 8.

$$K = I_{FVO} \frac{T_{out}}{2} \frac{1}{K'+1} \qquad \text{Mathematical model 8}$$

where $I_{FVC}$ is the current supplied to $C_x$, $T_{out}$ is the period of input signal applied to the PMOS transistor (mp), K' is the ratio of $C_x$ to $C_y$.

As previously explained, the voltage-frequency converter (600) in the phase-locked loop with two negative feedback loops according to the present invention works as an effective resistance(R) of the loop filter(300), and also has the function of suppressing the noise of the voltage controlled oscillator (400). It also enhances the stability of the phase-locked loop with two negative feedback loops which leads to use more various types of loop filter(300). These loop filters(300) can suppress phase noise further.

Figure 11:
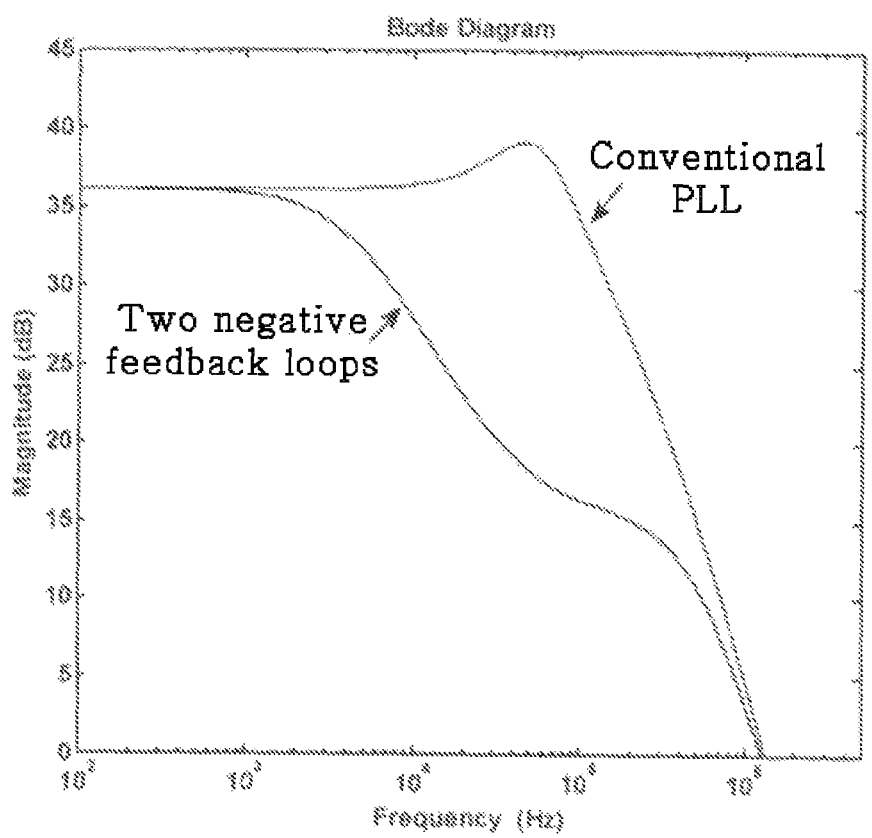
FIG. 11 is a graph illustrating transfer functions of the phase-locked loop with two negative feedback loops according to the present invention and the conventional phase-locked loop.

FIG. 11 is a graph illustrating transfer functions of the phase-locked loop with two negative feedback loops according to the present invention and the conventional phase-locked loop.

As shown in FIG. 11, the transfer function of the phase-locked loop with two negative feedback loops results in the phase noise reduction in the wide range of frequency and more than 25 dB around the bandwidth of the conventional PLL.

This means that the negative feedback loop of the voltage controlled oscillator (400) and voltage-frequency converter (600) narrows the bandwidth, which results in the phase noise reduction in the wide range of frequency.

Even though the above explained technical spirits of the present invention are specifically described in the preferred embodiments, it is important to note that the above embodiments are just for explanation, not for a limitation on the invention. Also, it will be apparent that one having ordinary skill in the art can make various modifications and changes thereto within the scope of the present invention. Therefore, the true scope of the present invention should be defined by the technical spirits of the appended claims.

What is claimed is:

1. A phase-locked loop with two negative feedback loops comprising:
    a phase frequency detector to compare the phase difference between the input signal and the feedback signal of a frequency-phase-locked loop, and to output up or down signal based on the phase difference;
    a charge pump to output the current proportionate to the outputted up or down signals;
    a loop filter output the voltage by filtering the outputted current;
    a voltage controlled oscillator to output the frequency based on the outputted voltage;
    a divider to divide the outputted frequency and to feedback the outputted frequency to the phase frequency detector;
    a frequency voltage converter to generate the voltage corresponding to the outputted frequency to suppress noise of the outputted frequency of the voltage controlled oscillator by feedbacking the generated voltage to the voltage controlled oscillator.

2. The phase-locked loop of claim 1, wherein the voltage controlled oscillator comprises a ring oscillator and an LC oscillator.

3. The phase-locked loop of claim 1, wherein the inner loop of the frequency-voltage converter and the voltage controlled oscillator comprise a negative feedback closed loop independently from the closed loop of the whole phase-locked loop.

\* \* \* \* \*